(12) United States Patent
Troutman et al.

(10) Patent No.: US 6,300,796 B1
(45) Date of Patent: Oct. 9, 2001

(54) HIGH VOLTAGE PMOS LEVEL SHIFTER

(75) Inventors: Bruce Lee Troutman, Meridian; Peter D. Manos, II, Boise, both of ID (US)

(73) Assignee: ZiLOG, Inc., Campbell, CA (US)

( * ) Notice: Subject to any disclaimer, the term of this patent is extended or adjusted under 35 U.S.C. 154(b) by 0 days.

(21) Appl. No.: 09/253,432

(22) Filed: Feb. 19, 1999

(51) Int. Cl.[7] .............................................. H03K 19/0175
(52) U.S. Cl. ................................. 326/81; 326/68; 326/120
(58) Field of Search .................................. 326/81, 83, 68, 326/120, 122, 119, 121

(56) References Cited

U.S. PATENT DOCUMENTS

| | | |
|---|---|---|
| 4,161,663 | 7/1979 | Martinez . |
| 4,663,701 | 5/1987 | Stotts . |
| 4,831,284 * | 5/1989 | Anderson et al. ................... 307/450 |
| 4,890,146 | 12/1989 | Williams et al. . |
| 4,920,284 * | 4/1990 | Denda ................................... 307/475 |
| 5,243,236 * | 9/1993 | Mcdaniel .............................. 307/443 |
| 5,406,142 | 4/1995 | Nakama et al. . |
| 5,457,420 | 10/1995 | Asada . |
| 5,669,684 | 9/1997 | Agan . |
| 5,684,415 | 11/1997 | McManus . |
| 5,698,993 | 12/1997 | Chow . |
| 5,736,774 | 4/1998 | Fujihira . |
| 5,821,800 | 10/1998 | Le et al. . |

* cited by examiner

*Primary Examiner*—Michael Tokar
*Assistant Examiner*—Anh Tran
(74) *Attorney, Agent, or Firm*—Skjerven, Morrill MacPherson, LLP

(57) ABSTRACT

A high voltage level shifter includes one or more complementary pairs of transistors connected together in series separate the output terminal from the input terminal so as to prevent junction breakdowns, oxide breakdowns, and punch-through breakdowns.

43 Claims, 6 Drawing Sheets

HIGH VOLTAGE PMOS LEVEL SHIFTER

BACKGROUND OF THE INVENTION

1. Field of the Invention

The present invention relates to the field of high voltage PMOS circuits. Specifically, the present invention relates to level shifter circuits having complimentary low voltage inputs and complementary high voltage outputs.

2. Discussion of the Related Art

Due to device limitations, conventional level shifter circuits for high voltage operations are prone to breaking down when high voltage is present. Specifically, MOSFET parameters which may limit conventional circuits ability to handle high voltage are the oxide breakdown voltage, the punch-through breakdown voltage, and the junction breakdown voltage.

The oxide breakdown voltage is the gate to source or the gate to drain voltage at which the gate oxide ruptures. For example, the gate oxide breakdown voltage of a modern device with gate oxide thicknesses of about 150 Angstroms is approximately 12 volts. However, with sufficient gate oxide thicknesses, destructive gate oxide ruptures are eliminated.

The punch-through breakdown voltage is the drain to source or source to drain voltage at which the drain current abruptly increases. Continued operation in this condition may generate enough heat to damage the MOSFET. The punch-through breakdown can be prevented by constructing the gate length of the MOSFET longer then the drain to source or source to drain depletion length.

Even when the parameters of a MOSFET are adequate to overcome oxide and punch-through breakdowns, a junction breakdown can still occur. The junction breakdown voltage is the drain or source to substrate voltage that is the level of reverse bias between the drain or source and the substrate at which the reverse-biased diode junction used for electrical isolation of the drain or source breaks down due to avalanching or Zener behavior. For a typical modern device parameters, the junction breakdown voltage for a standard transistor having a 10 volt gate to substrate voltage is about 10 volts. At this gate voltage level, as the gate voltage rises, the junction breakdown voltage increases approximately linearly with the gate voltage by a factor of about 1.0 times the gate to substrate voltage.

As is apparent from the above discussion, a need exists for a high voltage PMOS level shifter which allows switching to occur during high voltage operation without violating any breakdown limitations, especially the junction breakdown limitation.

SUMMARY OF THE INVENTION

Conventional high voltage level shifters are not able to switch states while operating under the high voltage conditions because junction breakdown constraint would be violated under these circumstances. The oxide breakdown voltage constraint and the punch-through voltage constraint also limited the feasible high voltage circuit designs. Thus, an object of the present invention is to provide a high voltage level shifter which does not violate the junction breakdown, oxide breakdown, and the punch-through breakdown constraints According to the present invention, one or more complementary pairs of transistors connected together in series separate the output terminal from the input terminal. Preferably, each pair has a standard high voltage enhancement PMOS with limited breakdown characteristics such as less than 17 volts, and a high voltage depletion PMOS with high voltage breakdowns such as greater than 17 volts.

In the preferred embodiments, when connected in series, the high voltage depletion PMOS protects the standard high voltage enhancement PMOS from breakdowns at high voltages, for example, that can range approximately between 16 and 20 volts. Typically transistors that can withstand high voltages have slower switching speed than transistors that cannot withstand high voltages.

With respect to the electrical connections of the series transistor pair in the preferred embodiments, the source of the high voltage depletion PMOS and the drain of the standard high voltage enhancement PMOS are connected together. The substrates of both transistors and the source of the standard high voltage enhancement PMOS are tied to a constant first voltage source preferably approximately between 16 and 20 volts. The gates of both transistors are connected to a second voltage source that preferably is selectively about 0 volt or about between 16 and 20 volts for turning on and for turning off both transistors respectively. The drain of the high voltage depletion PMOS is tied to a third voltage source that preferably is selectively about 0 volt or about between 16 and 20 volts when both transistors are off and when both transistors are on respectively.

One or more of the inventive series transistor pairs can be used within various circuitry embodiments to shift a low voltage preferably approximately between 0 and 5 volts to a high voltage preferably approximately between 16 and 20 volts without suffering from any high voltage breakdowns.

These and other features and advantages of the present invention will be apparent from the Figures as fully explained in the Detailed Description of the Preferred Embodiments.

DETAILED DESCRIPTION OF THE PREFERRED EMBODIMENTS

Conventional high voltage level shifters were unable to switch states when the high voltage supply was present due to, for example, the junction breakdown between the drain and the substrate. The high voltage level shifter circuit according to the present invention was first used in applications of Zilog EEPROM product line. EEPROM memory typically requires unusually high voltages for programming and erase operations. The present inventive high voltage level shifter circuit can be applied to EEPROM and flash memory technologies and other high voltage level shifting applications. The present invention is particularly well suited for operation in high voltage PMOS circuits.

Figure 1:
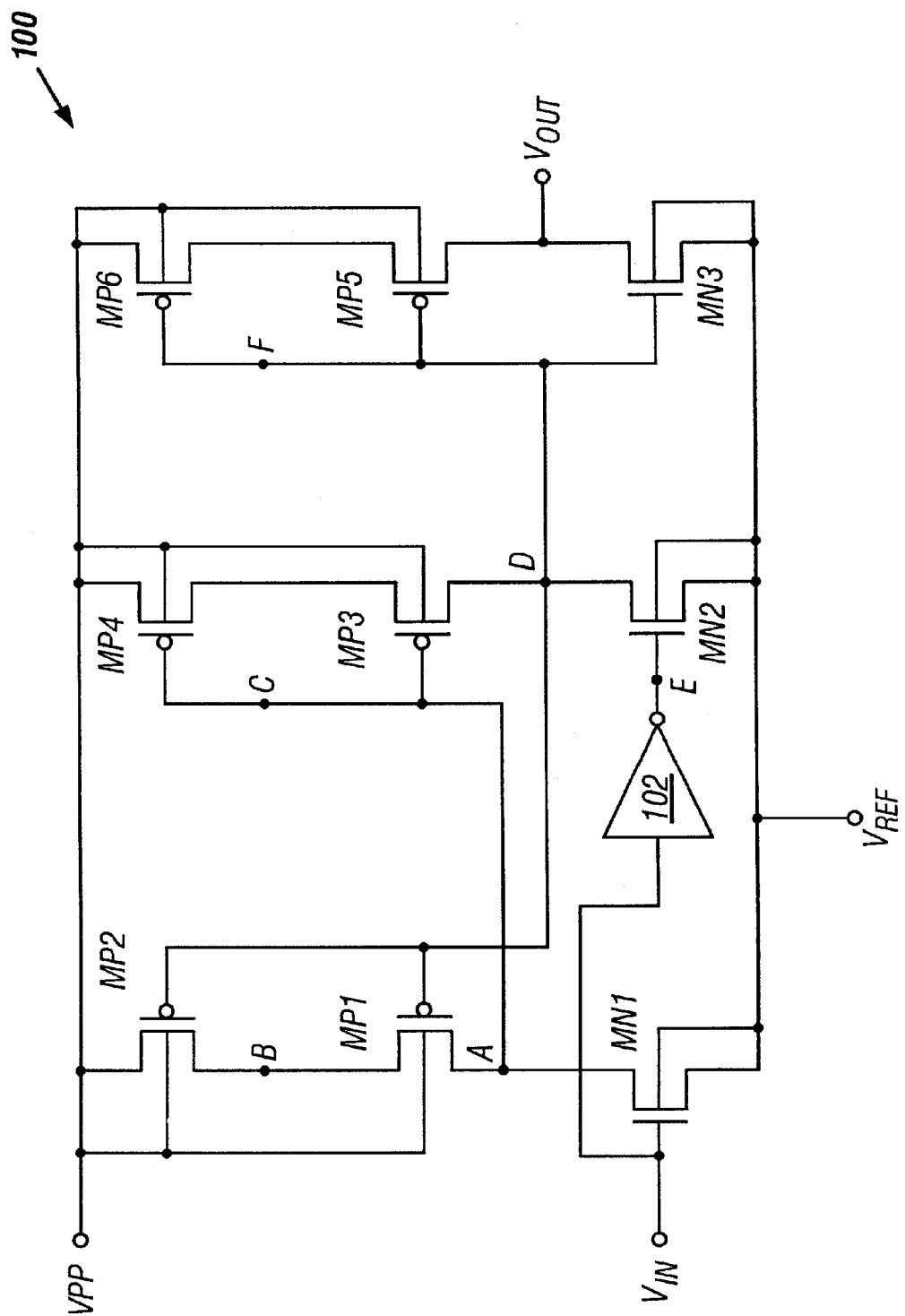
FIG. 1 illustrates a first preferred embodiment of the present inventive level shifter circuit particularly including a first and a second complementary series transistor pairs for voltage shifting and a third series transistor air operating as an output driver.

FIG. 1 shows a first preferred embodiment of the present inventive level shifter circuit 100. In the circuit 100, there are 6 PMOS transistors of MP1 through MP6, three NMOS transistors of MN1 through MN3, and one inverter 102. MP1, MP3, and MP5 preferably are high voltage depletion PMOS transistors with high voltage breakdowns, for example, greater than 17 volts. In addition, MP1, MP3, and MP5 preferably have their threshold voltages ("Vt's") set at a low voltage level such that they are easily turned on to conduct at approximately 0 volt but can be easily turned off under back biased conditions that occur when the source is not at the same voltage potential as the substrate. MP2, MP4, and MP6 preferably are standard high voltage enhancement PMOS transistors with limited voltage breakdowns, for example, less than 17 volts. MN1, MN2, and MN3 preferably are high voltage intrinsic NMOS transistors. Inverter 102 preferably is a low voltage inverter.

With respect to their electrical connections, MP1 and MP2 are connected together between a source voltage Vpp and node A. Gates of MP1 and MP2 are connected to node D. Substrates of MP1 and MP2 are connected to Vpp. Preferably, the substrates of MP1 and MP2 are sharing a common N-well to minimize circuit area. With respect to MP3 and MP4, they are connected together between Vpp and node D. Gates of MP3 and MP4 are connected to node A. Substrates of MP3 and MP4 are connected to Vpp and preferably are sharing a common N-well to minimize circuit area. With respect to MP5 and MP6, they are connected together between Vpp and an output terminal for outputting an output voltage Vout. Gates of MP5 and MP6 are connected to node D. Substrates of MP5 and MP6 are connected to Vpp and preferably are sharing a common N-well to minimize circuit area. During the operation of the circuit 100 of FIG. 1, the series transistor pair of MP5–MP6 functions as an output driver.

Furthermore, MN1 is connected between node A and Vref. A gate of MN1 is connected to an input terminal for inputting an input voltage Vin while a substrate of MN1 is connected to Vref As for the inverter 102, it has an input and an output. The input of the inverter 102 is connected to Vin while its output at a node E is connected to a gate of MN2. With respect to MN2, it is connected between node D and Vref A substrate of MN2 is connected to Vref Furthermore, MN3 is connected between the output terminal and Vref A gate of MN3 is connected to node D while a substrate of MN3 is connected to Vref.

As for voltage signals, in this example, the source voltage Vpp is a constant voltage approximately between 16 and 20 volts. The input voltage Vin has a first and a second input voltage signals. The first input voltage signal is about 0 volt ("low") while the second input voltage signal is approximately between 2 and 5 volts ("high"). Vref preferably is grounded or is about 0 volt. The output voltage Vout has a magnitude of approximately between 16 and 20 volts when Vin is low and a magnitude of 0 volt when Vin is high as explained below in the operations of FIGS. 2 and 3 respectively.

Figure 2:
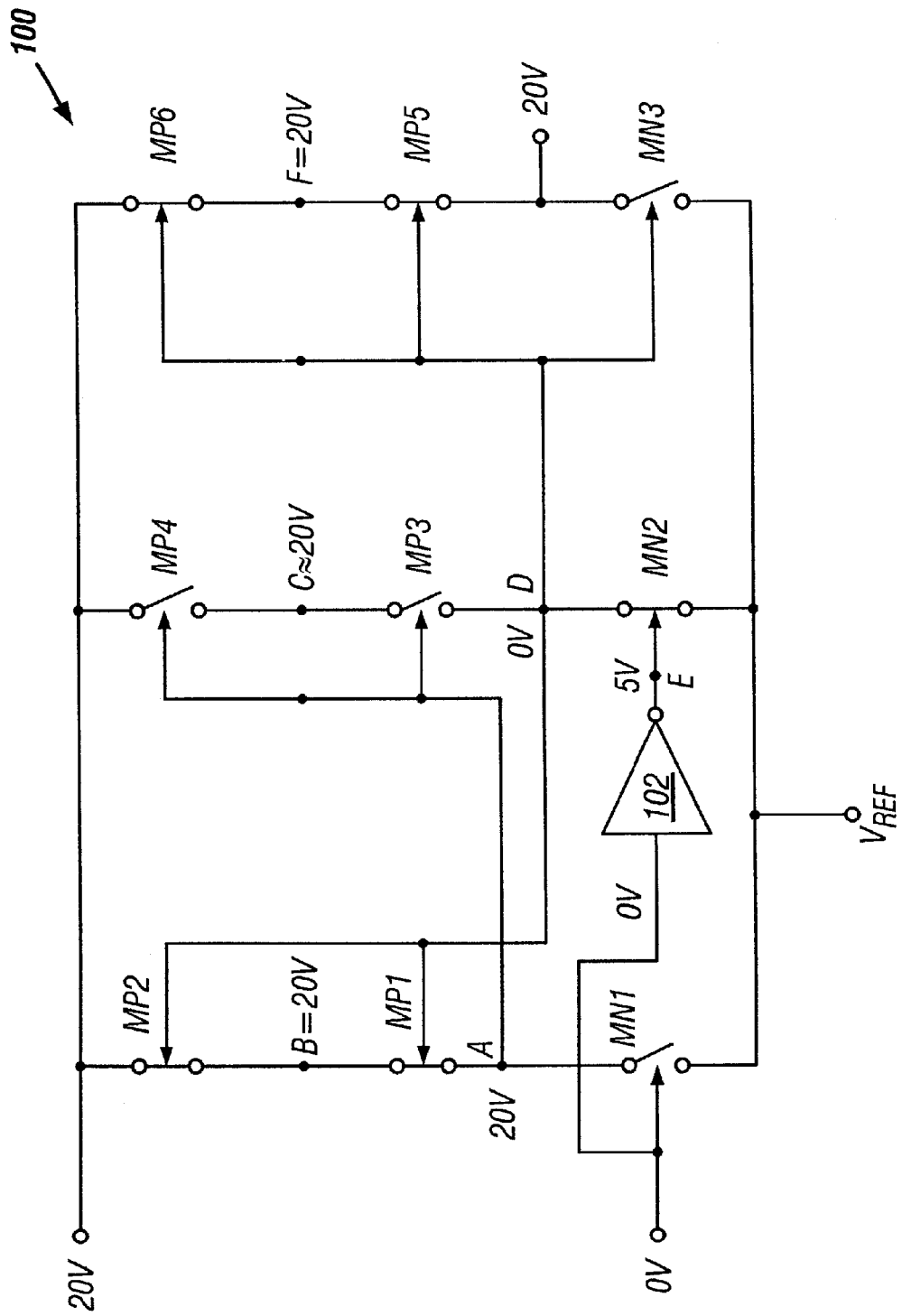
FIG. 2 illustrates the operation of the circuit of FIG. 1 when Vin is 0 volt or low.

FIG. 2 illustrates the operation of the circuit 100 of FIG. 1 when Vin is 0 volt. For this operation, it is assumed that the first and second input signals of Vin are 0 volt and 5 volts respectively and that Vpp is 20 volts. Thus, when Vin is 0 volt or low, MN1 is off and the output of the inverter 102 at node E is 5 volts because its output is not low, i.e. high, when its input is low, and vice versa. Since the input of the MN2 is connected to the output of the inverter 102 which is high, MN2 is on to conduct and thereby pulls up so that the voltage at node D is 0 volt. As a result, the pairs of MP1–MP2 and MP5–MP6 are turned on to conduct because their gates' voltage is low. Therefore, when MP2 and MP6 are on, the voltages at nodes B and F are 20 volts because the substrates of MP2 and MP6 are connected to Vpp which is constantly at 20 volts. Similarly, the voltage at node A and the output voltage Vout at the output terminal are 20 volts because the substrates of MP1 and MP5 are connected to Vpp respectively and because both MN1 and MN3 are off respectively.

Since the voltage at node A is 20 volts, the series transistor pair of MP3–MP4 is off. As a result, note that the voltage at node C floats at approximately 20 volts, that is, within a few tenths of a volt from 20 volts. This condition does not allow destructive junction voltages to be applied to MP4 because the magnitudes of the drain to substrate and source to substrate junction voltages of MP4 are a few tenths of a volt and 0 volt respectively. The values of these junction voltages are clearly within the breakdown voltage limitation of MP4 which is less than 17 volts. Additionally, MP4 preferably has [1] a sufficient gate oxide thickness to prevent destructive gate oxide ruptures and [2] a sufficient gate length that is longer that the drain to source depletion length to prevent punch-through breakdowns. Accordingly, in the series transistor pair of MP3–MP4, the MP3 protects MP4 from high voltage breakdowns.

On the other hand, by putting MP4 in series with MP3, MP4 guarantees a back biased condition on MP3 so that MP3 remains off to protect MP4. As discussed above with respect to FIG. 2, when Vin is low, the voltage at node C floats within a few tenths of a volt from 20 volts while the voltage at node A is 20 volts. Thus, MP3 is under back biased condition because its source voltage, which is equivalent to the voltage at node C, is not at the same voltage potential as its gate voltage, which is equivalent to the voltage at node A. The back biased condition helps to keep MP3 off because p-channel conduction of PMOS's requires a negative gate to source voltage that is less than the negative value of Vt. Here, the opposite is true, that is, MP3's gate voltage which is the voltage at node A is greater than its source voltage which is the voltage at node C. In other words, the gate to source voltage of MP3 is positive, not negative, and is also greater than the Vt of MP3 which is a negative voltage having a magnitude close to 0 volt because the Vt of MP3 is set at a low voltage level. Furthermore, MP4 also guarantees that even if there is a small leakage across MP3, the series transistor pair of MP3–MP4 will still be off. Accordingly, in the series transistor pair of MP3–MP4, MP4 ensures that MP3 continues to remain off when MP3 is off and is protecting MP4 from high voltage breakdowns.

Figure 3:
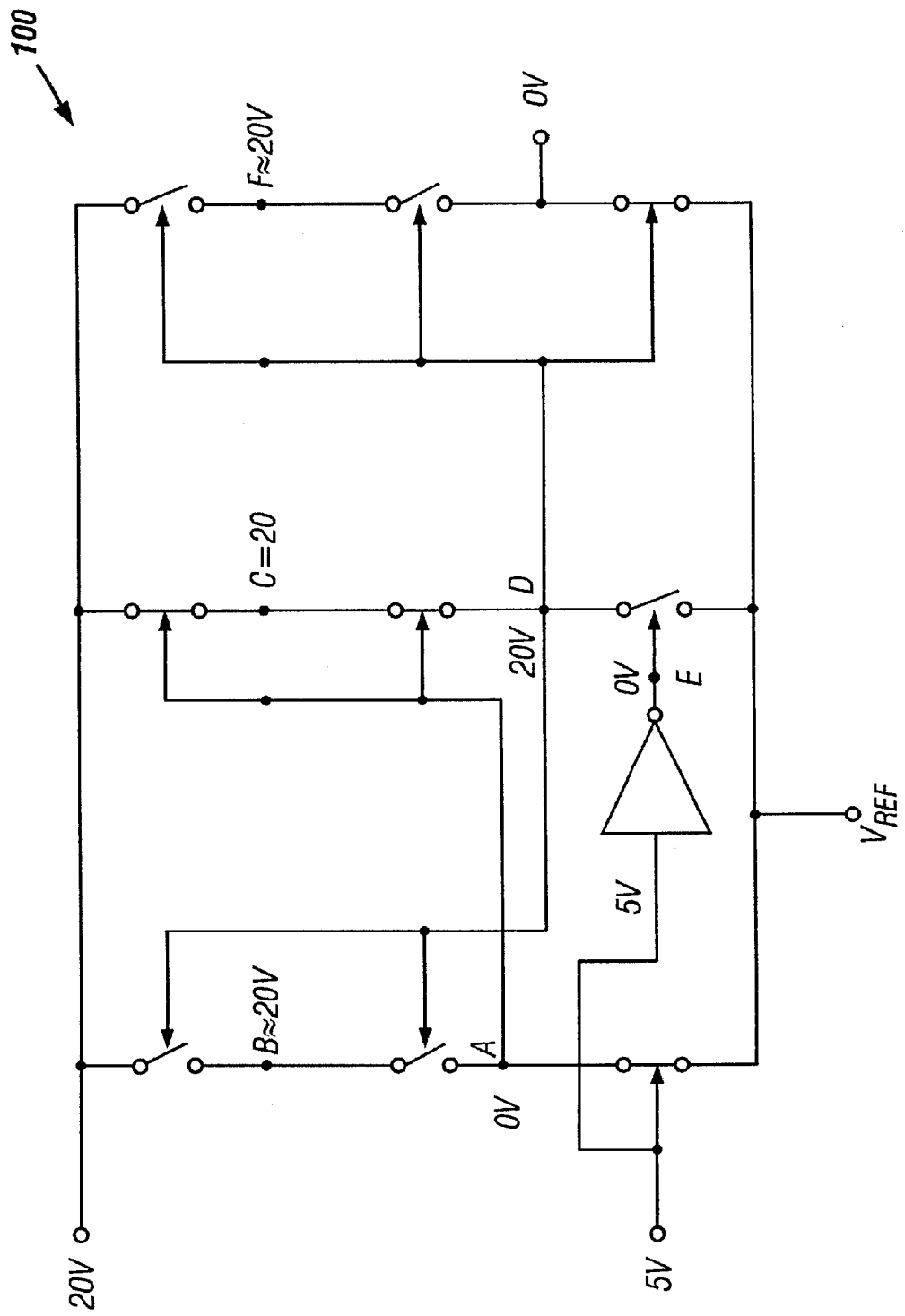
FIG. 3 illustrates the operation of the circuit of FIG. 1 when Vin is 5 volts or high.

In FIG. 3, the operation of the circuit 100 of FIG. 1 is shown when the input voltage Vin is 5 volts. For this operation, it is also assumed that the first and second input signals of Vin are 0 volt and 5 volts respectively and that Vpp is 20 volts. Thus, when Vin is 5 volts or high, first, MN1 is on and thereby pulls up so that the voltage at node A is 0 volt, and second, the output of the inverter 102 is 0 volt because its output is low when its input or Vin is high.

As a result, since the voltage at node A is low, MP3 and MP4 are turned on to conduct because their gates' voltage is low. Consequently, the voltage at node C is 20 volts because the substrate of MP4 is connected to Vpp which is constantly at 20 volts. Similarly, the voltage at node D is also at 20 volts because the substrate MP3 is connected to Vpp and MN2 is off MN2 is off because its input is connected to the output of the inverter 102 which is low.

Furthermore, the pairs of MP1–MP2 and MP5–MP6 are off because their gates' voltage, which is the voltage at node D, is 20 volts or high. As a result, note that both nodes B and F float at approximately 20 volts, that is, within a few tenths of a volt from 20 volts. This conditions do not allow destructive junction voltages to be applied to MP2 and MP6 because the magnitudes of the drain to substrate and source to substrate junction voltages of MP2 and MP6 are a few tenths of a volt and 0 volt respectively. The values of these junction voltages are clearly within the breakdown voltage limitation of MP2 and MP6 which is less than 17 volts. Additionally, both MP2 and MP6 preferably have [1] a sufficient gate oxide thickness to prevent destructive gate oxide ruptures and [2] a sufficient gate length that is longer that the drain to source depletion length to prevent punch-through breakdowns. Accordingly, in the series transistor pairs of MP1–MP2 and MP5–MP6, the MP1 and MP5 protect MP2 and MP6, respectively, from high voltage breakdowns.

On the other hand, by putting MP2 and MP6 in series with MP1 and MP5 respectively, MP2 and MP6 guarantee a back biased condition on MP1 and MP5 respectively, so that both MP1 and MP5 remain off to protect MP2 and MP6, respectively. As discussed above with respect to FIG. 3, when Vin is high, voltages at nodes B and F float within a few tenths of a volt from 20 volts while the voltage at node A is 0 volt. Thus, MP1 and MP5 are under back biased condition because their source voltages, which are equivalent to the voltages at nodes B and F respectively, are not at the same voltage potential as their gate voltages, which are equivalent to the voltages at node D. The back biased conditions help to keep MP1 and MP5 off because p-channel conduction of PMOS's requires a negative gate to source voltage that is less than the negative value of Vt. Here, the opposite is true, that is, MP1's and MP3's gate voltages which are the voltage at node D is greater than their source voltages which are the voltage at nodes B and F respectively. In other words, the gate to source voltages of MP1 and MP5 are positive, not negative, and are greater than the Vt's of MP1 and MP5 which should be negative voltages having a magnitude close to 0 volt because the Vt's of MP1 and MP5 are set at a low voltage level. Furthermore, both MP2 and MP6 also guarantee that even if there is a small leakage across MP1 and MP5 respectively, the series transistor pairs of MP1–MP2 and MP5–MP6 will still be off. Accordingly, in the series transistor pairs of MP1–MP2 and MP5–MP6 ensure that MP1 and MP5 continue to remain off when MP1 and MP5 are off and are protecting MP2 and MP6 from high voltage breakdowns, respectively.

Lastly, when the voltage at node D in FIG. 3 is 20 volts, MN3 is on because its gate voltage is also 20 volts. Thus, MN1 pulls up and thereby the output voltage Vout is 0 volt.

In summary, the operation of the circuit 100 of FIG. 1 illustrated by FIGS. 2–3 is as follows: [1] when Vin is 0 volt or low, Vout is 20 volts, and [2] when Vin is 5 volts or high, Vout is 0 volt.

Figure 4:
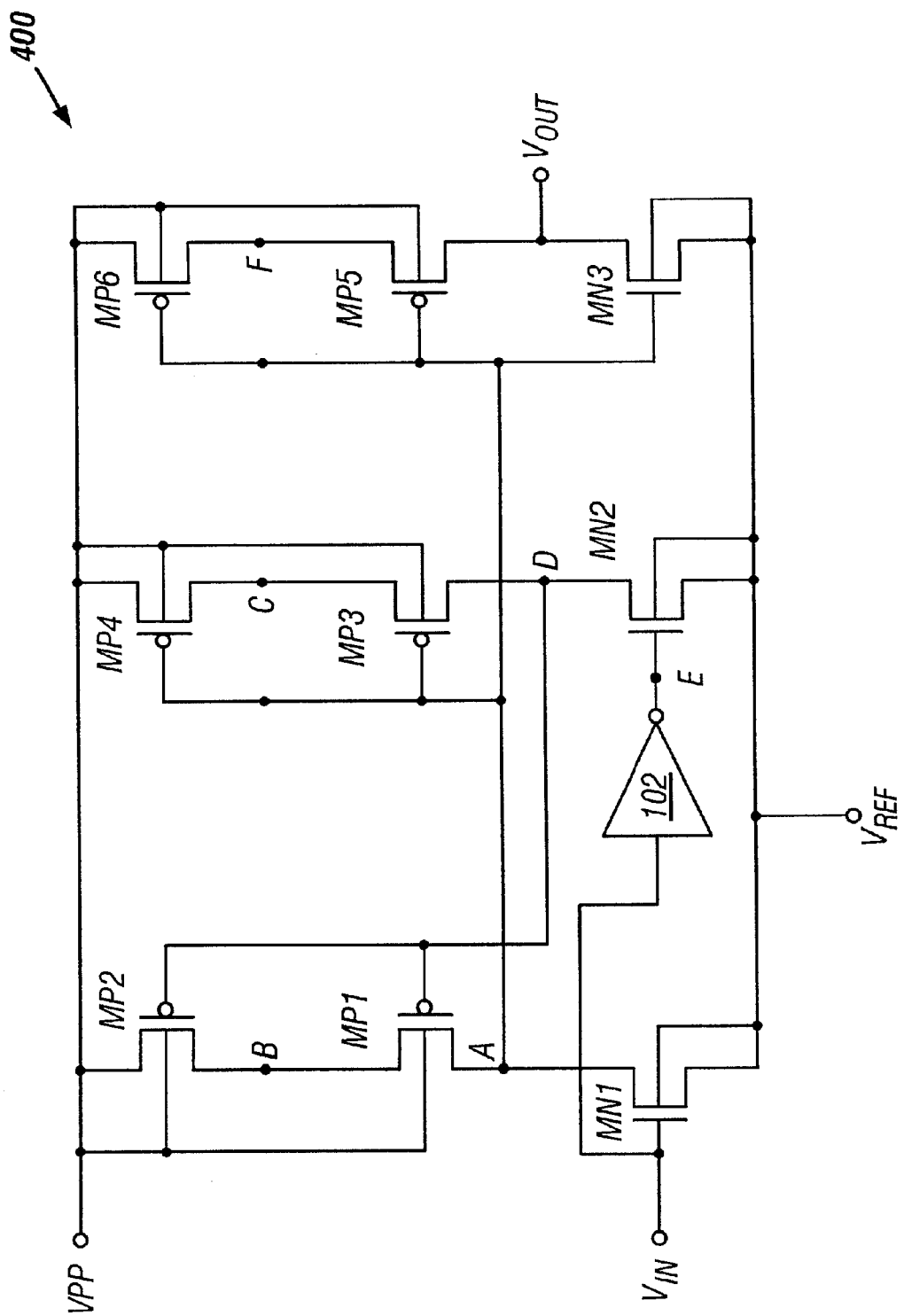
FIG. 4 illustrates a second preferred embodiment of the present inventive level shifter circuit that is similar to the circuit of FIG. 1 except gates of the third series transistor pair operating as an output driver are connected to node A, not node D.

FIG. 4 illustrates a second preferred embodiment of a present inventive circuit 400 that is similar to the circuit 100 of FIG. 1. Similar numbers and symbols are used for similar electrical components. However, note that the gates of the third series transistor pair of MP5–MP6 operating as the output driver and the gate of MN3 are connected to node A instead of node D as illustrated in FIGS. 1–3. As a result, for example, when Vin of the circuit 400 is 0 volt or low, Vout is also 0 volt, and when its Vin is 5 volts or high, Vout is 20 volts. In contrast, in the operation of the circuit 100, the opposite is true, that is, when its Vin is 0 volt or low, Vout is 20 volts, and when its Vin is 5 volts or high, Vout is 0 volt.

Figure 5:
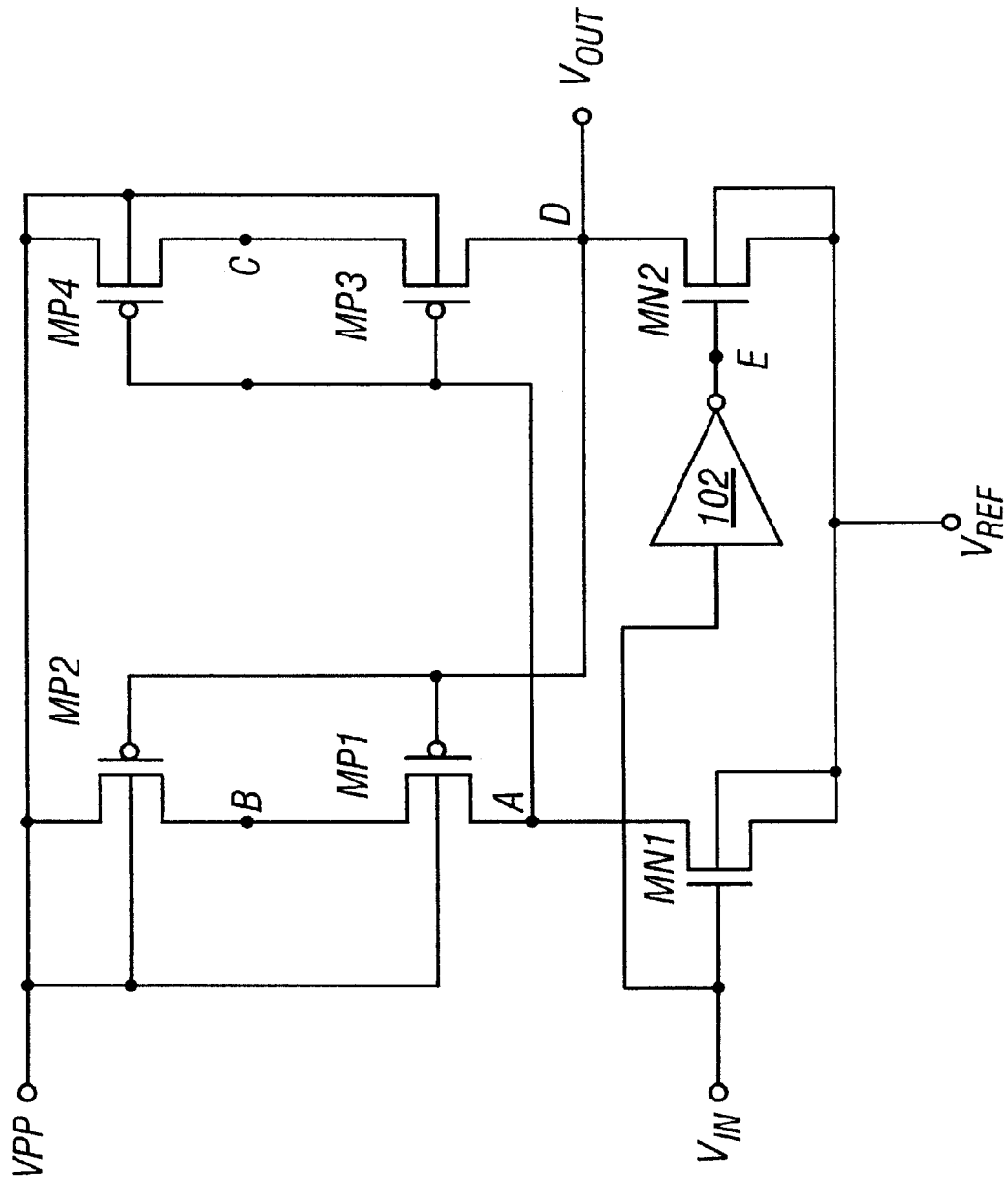
FIG. 5 illustrates a third preferred embodiment of the present inventive level shifter circuit particularly including only two complementary series transistor pairs for voltage shifting and an output terminal that is connected to node D.

FIG. 5 illustrates a third preferred embodiment of a present inventive level shifter circuit 500 that is similar to the circuit 100 except that the circuit 500 does not include the third series transistor pair for functioning as the output driver. Particularly, note that the output terminal is directly connected to node D. Again, similar numbers and symbols are used for similar electrical components. Additionally, the circuit 500 also operates like the circuit 100 of FIG. 1. Therefore, for example, when Vin of the circuit 500 is 0 volt or low, Vout is 20 volts, and when its Vin is 5 volts or high, Vout is 0 volt.

Figure 6:
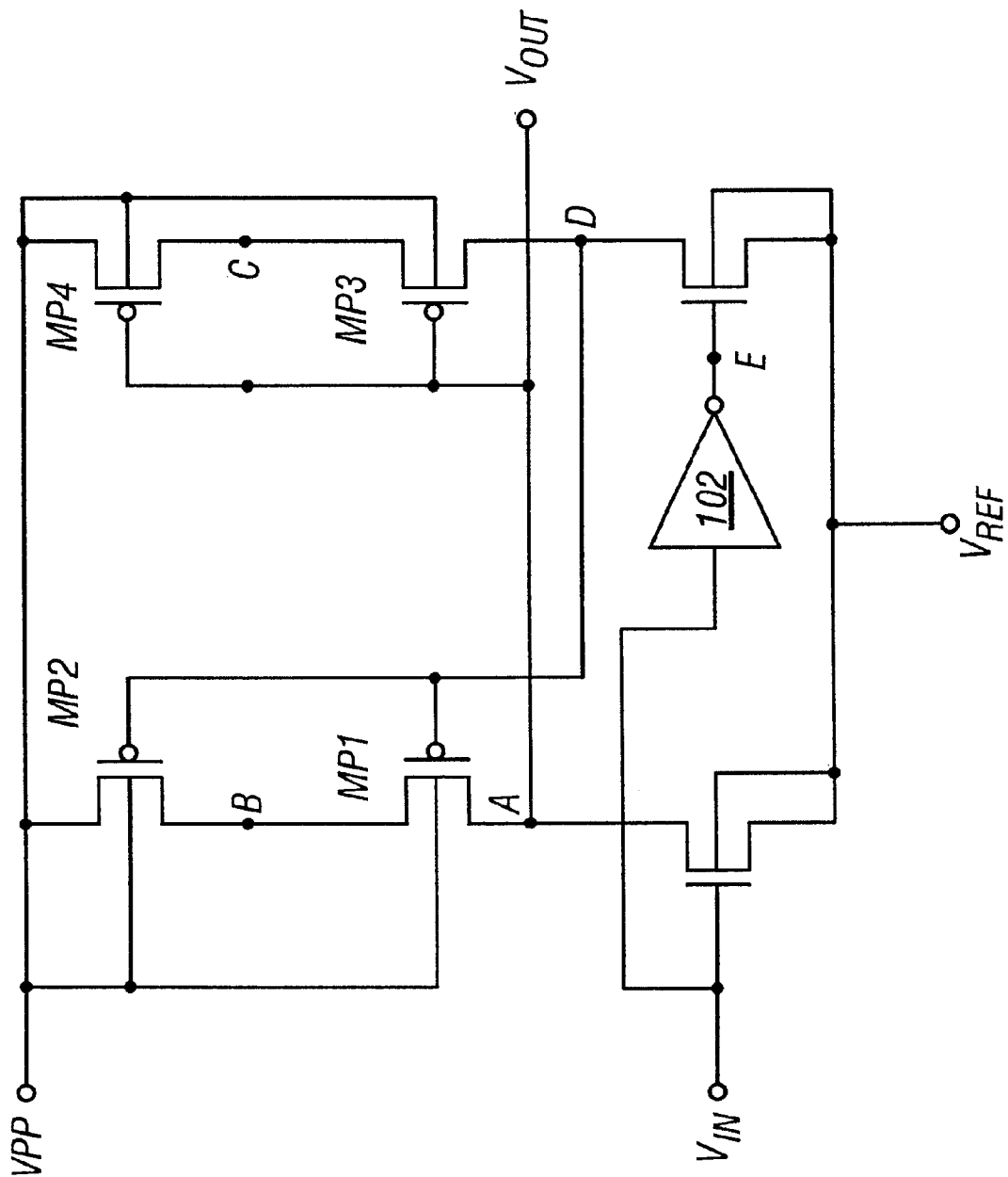
FIG. 6 illustrates a fourth preferred embodiment of the present inventive level shifter circuit similar to the circuit of FIG. 5 except the output terminal is connected to node A.

FIG. 6 illustrates a fourth preferred embodiment of a present inventive level shifter circuit 600 similar to the circuit 500 of FIG. 5 except that the output terminal is directly connected to node A, not node D because there is no third series transistor pair in the circuit 600 to operate as the output driver. Again, similar numbers and symbols are used for similar electrical components. In operation, the circuit 600 functions very similar to the circuit 400 of FIG. 4. That is, for example, when Vin of the circuit 600 is 0 volt or low, Vout is also 0 volt, and when its Vin is 5 volts or high, Vout is 20 volts.

In summary, like the circuit 100 of FIG. 1, the present inventive concept of FIGS. 4–6 is that MP1 and MP3 protect MP2 and MP4 respectively from high voltage breakdowns while MP2 and MP4 guarantee that MP1 and MP3 continue to remain off when MP1 and MP3 are off and are protecting MP2 and MP4 respectively. In addition, the present inventive concept also applies to the third series transistor pair in the circuit 400 of FIG. 4 operating as the output driver for the circuit 400.

With the present invention has been described in conjunction with several alternative embodiments, these embodiments are offered by way of illustration rather than by way of limitation. Those skilled in the art will be enabled by this disclosure to make various modifications and alterations to the embodiments described without departing from the spirit and scope of the present invention. Accordingly, these modifications and alterations are deemed to lie within the spirit and scope of the present invention as specified by the appended claims.

We claim:

1. A high voltage level shifter for receiving an input voltage signal having a predetermined magnitude of voltage and for generating an output voltage signal having a different magnitude of voltage, comprising:

a first pair of first and second field effect transistors of a first conductivity type connecting together in series between a voltage source line and a first node and having respective gate electrodes connected to a second node and respective substrates connected to said voltage source line;

a second pair of third and fourth field effect transistors of said first conductivity type connecting together in series between said voltage source line and said second node and having respective gate electrodes connected to said first node and respective substrates connected to said voltage source line;

a fifth field effect transistor of a second conductivity type connecting between said first node and a voltage reference line and having a gate electrode connected to an input terminal and a substrate connected to said voltage reference line;

an inverter having an input connected to said input terminal and an output;

a sixth field effect transistor of said second conductivity type connecting between said second node and said voltage reference line and having a gate electrode connected to said output of said inverter and a substrate connected to said voltage reference line;

an output terminal;

a third pair of seventh and eighth field effect transistors of said first conductivity type connecting together in series between said voltage source line and said output terminal and having respective gate electrodes connected to said first node and respective substrates connected to said voltage source line; and a ninth field effect transistor of said second conductivity type connecting between said output terminal and said voltage reference line and having a gate electrode connected to said first node and a substrate connected to said voltage reference line.

2. A high voltage level shifter for receiving an input voltage signal having a predetermined magnitude of voltage and for generating an output voltage signal having a different magnitude of voltage, comprising:

a first pair of first and second field effect transistors of a first conductivity type connecting together in series between a voltage source line and a first node and having respective gate electrodes connected to a second node and respective substrates connected to said voltage source line;

a second pair of third and fourth field effect transistors of said first conductivity type connecting together in series between said voltage source line and said second node and having respective gate electrodes connected to said first node and respective substrates connected to said voltage source line;

a fifth field effect transistor of a second conductivity type connecting between said first node and a voltage reference line and having a gate electrode connected to an input terminal and a substrate connected to said voltage reference line;

an inverter having an input connected to said input terminal and an output;

a sixth field effect transistor of said second conductivity type connecting between said second node and said voltage reference line and having a gate electrode connected to said output of said inverter and a substrate connected to said voltage reference line;

an output terminal;

a third pair of seventh and eighth field effect transistors of said first conductivity type connecting together in series between said voltage source line and said output terminal and having respective gate electrodes connected to said second node and respective substrates connected to said voltage source line; and a ninth field effect transistor of said second conductivity type connecting between said output terminal and said voltage reference line and having a gate electrode connected to said second node and a substrate connected to said voltage reference line.

3. The high voltage level shifter according to claim 1, in which said voltage source line is approximately between 16 and 20 volts and said voltage reference line is approximately 0 volt.

4. The high voltage level shifter of claim 3, wherein said input voltage signal is approximately 0 volt and said output voltage signal is approximately 0 volt.

5. The high voltage level shifter of claim 3, wherein said input voltage signal is approximately between 2 and 5 volts and said output voltage signal is approximately between 16 and 20 volts.

6. The high voltage level shifter according to claim 2, in which said voltage source line is approximately between 16 and 20 volts and said voltage reference line is approximately 0 volt.

7. The high voltage level shifter of claim 6, wherein said input voltage signal is 0 volt and said output voltage signal is approximately between 16 and 20 volts.

8. The high voltage level shifter of claim 6, wherein said input voltage signal is approximately between 2 to 5 volts and said output voltage signal is 0 volt.

9. A high voltage level shifter for receiving an input voltage signal having a predetermined magnitude of voltage and for generating an output voltage signal having a different magnitude of voltage, comprising:

a first pair of first and second field effect transistors of a first conductivity type connecting together in series between a voltage source line and a first node and having respective gate electrodes connected to a second node and respective substrates connected to said voltage source line;

a second pair of third and fourth field effect transistors of said first conductivity type connecting together in series between said voltage source line and said second node and having respective gate electrodes connected to said first node and respective substrates connected to said voltage source line;

a fifth field effect transistor of a second conductivity type connecting between said first node and a voltage reference line and having a gate electrode connected to an input terminal and a substrate connected to said voltage reference line;

an inverter having an input connected to said input terminal and an output;

a sixth field effect transistor of said second conductivity type connecting between said second node and said voltage reference line and having a gate electrode connected to said output of said inverter and a substrate connected to said voltage reference line; and an output terminal, wherein said first and third transistors are depletion PMOS transistors, wherein said second and fourth transistors are enhancement PMOS transistors, and wherein said fifth and sixth transistors are intrinsic NMOS transistors.

10. The high voltage level shifter according to claim 1 or 2, in which said seventh transistor is a depletion PMOS transistor, wherein said eighth transistor is an enhancement PMOS transistor, and wherein said ninth transistor is an intrinsic NMOS transistor.

11. The high voltage level shifter of claim 9, wherein said output terminal is connected to said first node.

12. The high voltage level shifter of claim 9, wherein said output terminal is connected to said first node.

13. The high voltage level shifter according to claim 10, in which said substrates of said PMOS transistors of each said pair share a common N-well.

14. The high voltage level shifter according to claim 10, wherein said enhancement PMOS transistors have a breakdown characteristic of less than approximately 17 volts and wherein said depletion PMOS transistors have a breakdown characteristic of greater than approximately 17 volts.

15. The high voltage level shifter of claim 9, wherein said inverter is a low voltage inverter.

16. A high voltage PMOS level shifter for receiving an input voltage signal having a predetermined magnitude of voltage and for generating an output voltage signal having a different magnitude of voltage, comprising:
- at least two pairs of transistors for high voltage level shifting in response to said input voltage signal, wherein each of said at least two pairs has an enhancement PMOS transistor and a depletion PMOS transistor that are connected together in series; and
- at least two transistors and at least one inverter for providing said input voltage signal to gates of said at least two pairs of transistors.

17. The high voltage PMOS level shifter of claim 16, wherein said at least one inverter is a low voltage inverter.

18. The high voltage PMOS level shifter of claim 16, wherein a first pair of the at least two pairs is connected between a first voltage source and a first node, further wherein gate electrodes of said transistors of said first pair are connected to a second node and wherein substrates of said transistors of said first pair are connected to said first voltage source.

19. The high voltage PMOS level shifter of claim 18, wherein a second pair of the at least two pairs is connected between said first voltage source and a second node, further wherein gate electrodes of said transistors of said second pair are connected to said first node and wherein substrates of said transistors of said second pair are connected to said first voltage source.

20. The high voltage PMOS level shifter of claim 19, wherein a first transistor of said at least two transistors is connected between said first node and a second voltage source, includes a gate electrode connected to an input terminal for inputting said input voltage signal, and includes a substrate connected to said second voltage source.

21. The high voltage PMOS level shifter of claim 20, wherein said at least one inverter has an input connected to said input terminal and an output.

22. The high voltage PMOS level shifter of claim 21, wherein a second transistor of said at least two transistors is connected between said second node and a second voltage source, includes a gate electrode connected to said output of said first transistor, and includes a substrate connected to said second voltage source.

23. The high voltage PMOS level shifter of claim 22, wherein said first voltage source is approximately between 16 and 20 volts and wherein the second voltage source is approximately 0 volt.

24. The high voltage PMOS level shifter of claim 23, wherein said second node is connected to an output terminal for outputting said output voltage signal.

25. The high voltage PMOS level shifter of claim 23, wherein said first node is connected to an output terminal for outputting said output voltage signal.

26. The high voltage PMOS level shifter of claim 24, wherein said output voltage signal is approximately between 16 and 20 volts when said input voltage signal is approximately 0 volt and wherein said output voltage signal is approximately 0 volt when input voltage signal is approximately between 2 and 5 volts.

27. The high voltage PMOS level shifter of claim 25, wherein said output voltage signal is approximately between 16 and 20 volts when said input voltage signal is approximately between 2 and 5 volts and wherein said output voltage signal is approximately 0 volt when input voltage signal is approximately 0 volt.

28. The high voltage PMOS level shifter of claim 16, wherein said at least two transistors are intrinsic NMOS devices.

29. The high voltage PMOS level shifter of claim 16, wherein said substrates of said transistors of each said at least two pairs share a common N-well.

30. The high voltage PMOS level shifter of claim 16, wherein said enhancement PMOS transistor has a breakdown characteristic of less than approximately 17 volts and wherein said depletion PMOS transistor has a breakdown characteristic of greater than approximately 17 volts.

31. A circuit comprising:
- a constant first voltage source approximately 16 and 20 volts,
- a second voltage source varying approximately between 0 volt and approximately 16 and 20 volts,
- a third voltage source varying approximately between 0 volt and approximately 16 and 20 volts when said second voltage source is approximately 16 and 20 volts and when said second voltage source is approximately 0 volt respectively,
- an enhancement PMOS transistor having a breakdown characteristic of less than approximately 17 volts; and
- a depletion PMOS transistor having a breakdown characteristic of greater than approximately 17 volts, wherein said enhancement PMOS transistor and said depletion PMOS transistor are connected together in series and in between said first voltage source and said third voltage source and include respective substrates connected to said first voltage source.

32. The circuit of claim 31, wherein said transistors turn on to conduct when said second voltage source is approximately 0 volt and thereby third voltage source is approximately 16 and 20 volts.

33. The circuit of claim 31, wherein said transistors are off when second voltage source is approximately 16 and 20 volts and thereby third voltage source is approximately 0 volt.

34. The circuit of claim 31, wherein said substrates of said enhancement PMOS transistor and said depletion PMOS transistor share a common N-well.

35. A method of protecting an enhancement PMOS transistor from high voltage breakdowns, which comprises:
- applying a first voltage selectively approximately 0 volt or approximately between 16 and 20 volts to gate electrodes of an enhancement PMOS transistor and a depletion PMOS transistor and thereby turning on both said transistors to conduct and turning off both said transistors respectively, wherein said transistors are connected together in series and in between a second voltage and a third voltage,
- applying said second constant voltage approximately between 16 and 20 volts, to substrates of said enhancement PMOS transistor and said depletion PMOS transistor when both said transistors are on and off and to a source of said enhancement PMOS transistor when said enhancement PMOS transistor is on and off, and
- applying said third voltage selectively approximately 0 volt and approximately between 16 and 20 volts when said transistors are off and on respectively, to a drain of said depletion PMOS transistor.

36. The high voltage level shifter according to claim 12, in which said voltage source line is approximately between 16 and 20 volts and said voltage reference line is approximately 0 volt.

37. The high voltage level shifter of claim 36, wherein said input voltage signal is approximately 0 volt and said output voltage signal is approximately 0 volt.

38. The high voltage level shifter of claim 36, wherein said input voltage signal is approximately between 2 and 5 volts and said output voltage signal is approximately between 16 and 20 volts.

39. The high voltage level shifter according to claim 12 or 2, in which said voltage source line is approximately between 16 and 20 volts and said voltage reference line is approximately 0 volt.

40. The high voltage level shifter of claim 39, wherein said input voltage signal is 0 volt and said output voltage is approximately between 16 and 20 volts.

41. The high voltage level shifter of claim 39, wherein said input voltage signal is approximately between 2 to 5 volts and said output voltage signal is 0 volt.

42. The high voltage level shifter according to claim 9, in which said substrates of said PMOS transistors of each said pair share a common N-well.

43. The high voltage level shifter according to claim 9, wherein said enhancement PMOS transistors have a breakdown characteristic of less than approximately 17 volts and wherein said depletion PMOS transistors have a breakdown characteristic of greater than approximately 17 volts.

* * * * *